United States Patent [19]

Corey et al.

[11] Patent Number: 4,567,379

[45] Date of Patent: Jan. 28, 1986

[54] PARALLEL CURRENT SHARING SYSTEM

[75] Inventors: Philip D. Corey, San Diego, Calif.; Elise T. Atkins, Deerfield Beach, Fla.

[73] Assignee: Burroughs Corporation, Detroit, Mich.

[21] Appl. No.: 613,315

[22] Filed: May 23, 1984

[51] Int. Cl.⁴ .................... H03K 3/01; H03K 17/687
[52] U.S. Cl. .................... 307/270; 307/254; 307/282; 307/571
[58] Field of Search ............ 302/270, 254, 871, 583, 302/282

[56] References Cited

U.S. PATENT DOCUMENTS 3,619,655 11/1971 Cunningham .................... 307/254
4,109,167 8/1978 Kaji et al. .................... 307/254

Primary Examiner—Stanley D. Miller
Assistant Examiner—B. P. Davis
Attorney, Agent, or Firm—Robert A. Green; Kevin R. Peterson; Mark T. Starr

[57] ABSTRACT

A circuit including a plurality of transistors in parallel for dividing load current substantially equally between the transistors including a transformer coupled to each transistor, with the primary winding of each transformer in series with the emitter-collector current flow path of its transistor and with all of the secondary windings connected together in series. The transistors are substantially identical in characteristics and rating, and the transformers are all substantially identical.

2 Claims, 4 Drawing Figures

4,567,379

PARALLEL CURRENT SHARING SYSTEM

BACKGROUND OF THE INVENTION

Some types of power supplies and other electronic equipment connect a plurality of power transistors in parallel to obtain optimum total current-carrying capacity for the system. This is done where the total current to be conducted is greater than the current-carrying capacity of one transistor. However, in such circuits, for the usual case of equally-rated transistors, it is important to share the total current substantially equally between all of the transistors. In the more general case, where dissimilarly-rated transistors might be paralleled, it is important to share the total load current in proportion to the various transistor ratings. Further, it is very desirable to be able to deal with, in the most general case, of up to an indefinite number, N, parallel-connected transistors, while still being able to obtain the desired sharing of the total load.

Although circuits are known for performing this function, none appears to be as simple, efficient and flexible as the circuit of the present invention.

DESCRIPTION OF THE INVENTION

Figure 1:
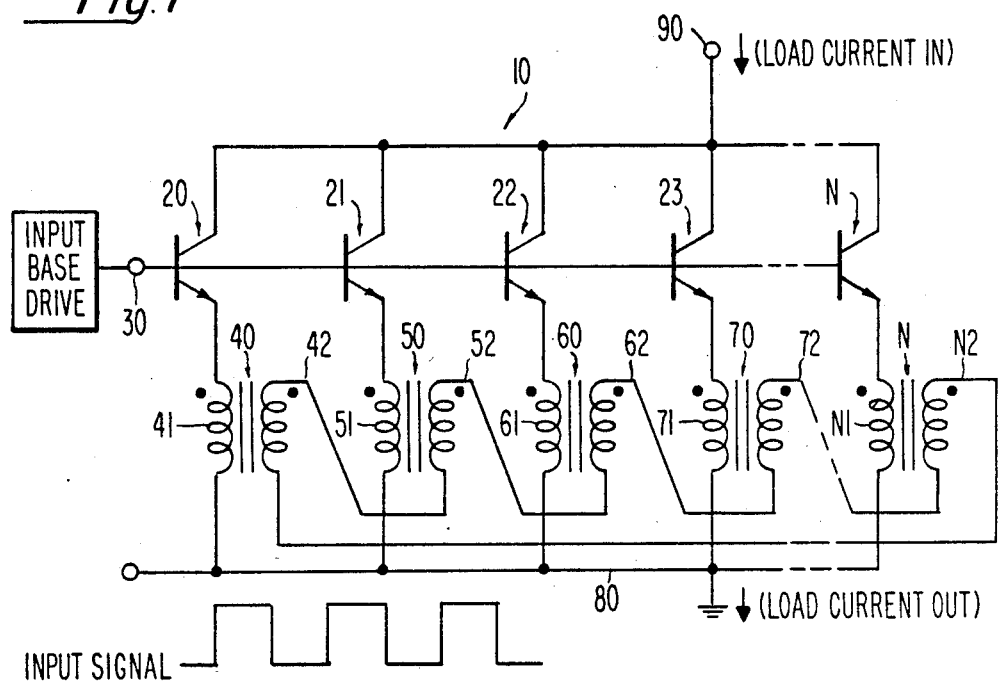
FIG. 1 is a schematic representation of the invention using NPN bipolar semiconductor devices.

Referring to FIG. 1, the circuit 10 includes a plurality of NPN transistors 20, 21, 22, 23 . . . N, connected in parallel, and with the electrodes of the transistors, emitter, collector, and base shown in conventional fashion. The base electrodes of all of the transistors are connected together and to an input terminal 30. The collector electrodes are connected together and to a common load terminal 90.

The circuit 10 includes transformers 40, 50, 60, 70 . . . N, one for each of the transistors, and the transformers include primary and secondary windings as shown. Current flows into the dot on each primary winding and out of the dot on each secondary winding, the "dots" being conventional winding direction polarity designators.

The emitter of transistor 20, considered the first in the series of N devices, is connected through the primary winding 41 of transformer 40 to a bus 80 which is coupled to a reference potential such as "ground". Similarly, the emitter of each of the other transistors is connected through the primary winding of its respective transformer to bus 80. In the more usual case where equal current sharing among individual transistors is the objective, the transformers are all identical, all of the primary windings are identical to each other, and all of the secondary windings are identical to each other. For the common case where the objective is to share current equally among equally-rated transistors, and for construction simplicity, all of the transformer windings, both primary and secondary, may be identical.

To connect in parallel transistors having unequal current-carrying capabilities, the primary and/or secondary winding turns ratios are selected in proportion to the unequal current-carrying capabilities of unequal transistors in order to accomplish current sharing which is properly apportioned in accordance with the individual transistor capabilities. This latter case may be less commonly encountered; however, one important distinction of this invention when compared to the prior art relates to the ease with which this invention can deal with enabling properly-apportioned current sharing among even unequally-rated active current flow devices.

As to the secondary windings of the transformers, the dotted end of the first 42 is connected to the non-dotted end of the second 52, and the dotted end of the second 52 is connected to the non-dotted end of the third 62, and the dotted end of the secondary winding 72 is connected to the non-dotted end of the succeeding transformer shown here to be the last or Nth transformer winding N2, and the dotted end of the last secondary winding N2 is connected to the non-dotted end of the first secondary winding 42.

Operation of the circuit 10 employs the principle of transformers:

$$N_p I_p = N_s I_s$$

which states that primary turns times primary current equals secondary turns times secondary current.

In operation of the circuit 10, an input signal made up of generally rectangular current pulses at a frequency of approximately 20 KHz, resulting in a typical voltage amplitude of approximately 1.5 volts for transistor turn on, is applied between terminal 30 and ground bus 80, and thus to the base electrodes of all of the transistors. This, in turn, causes collector-to-emitter currents to flow in all of the transistors, and this current flow in the first transistor generates a current which contributes to the secondary current which circulates through all of the secondary windings. As shown below, the secondary current which flows is forced to be substantially proportional to the average current flowing through the array of paralleled transistors.

Any undesired inequality in transistor current-sharing will result in a corrective voltage across each of the respective transformer windings, both primary and secondary, the result being to appropriately adjust the respective transistor base currents such that the desired current-sharing is achieved.

Figure 2:
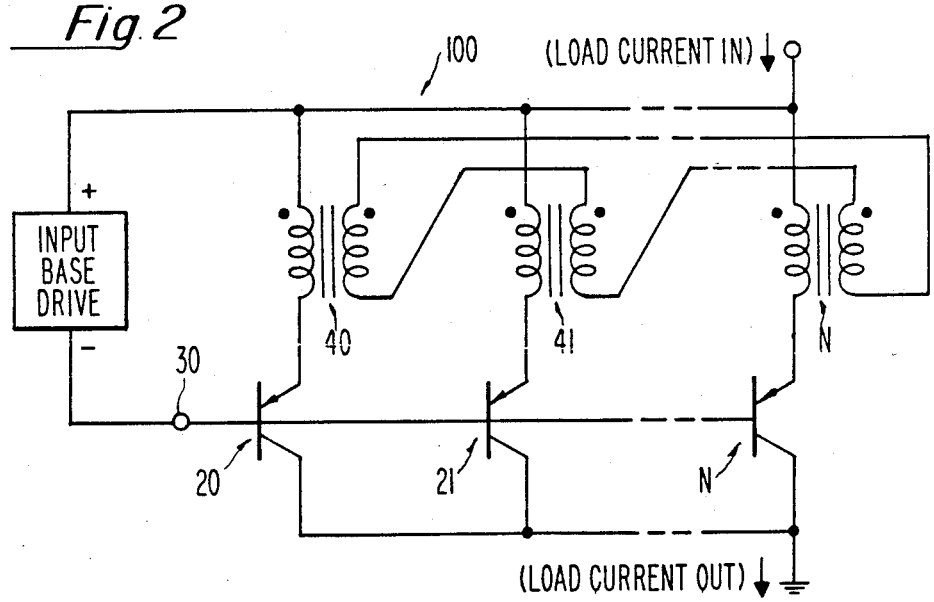
FIG. 2 is a schematic representation of the invention using PNP bipolar semiconductor devices.
Figure 3:
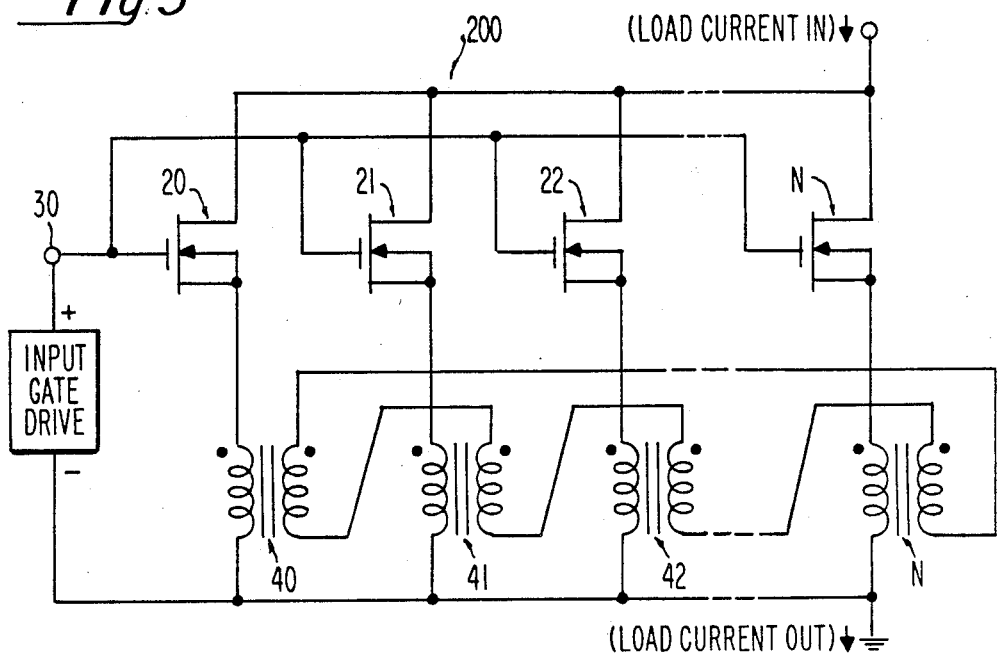
FIG. 3 is a schematic representation of the invention using NMOS semiconductor devices.
Figure 4:
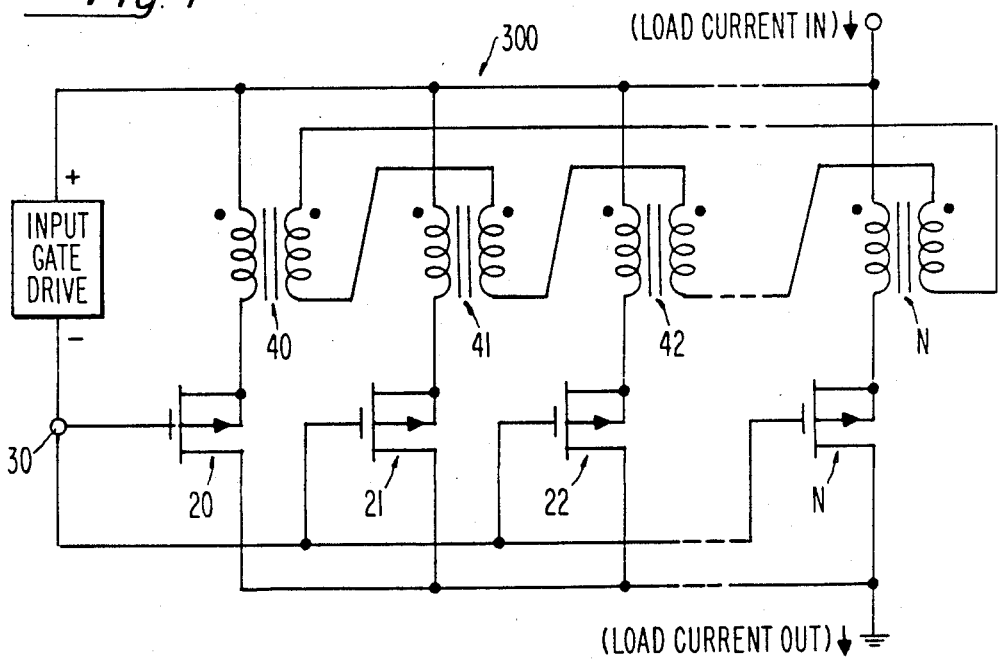
FIG. 4 is a schematic representation of the invention using PMOS semiconductor devices.

The principles of the invention for current-sharing may also be employed as illustrated in circuit 100 in FIG. 2 with PNP bipolar transistors, in circuit 200 in FIG. 3 using NMOS transistors, and in circuit 300 in FIG. 4 using PMOS transistors. In the cases where MOS-type transistors are parallelled, the drive source is commonly a voltage source since MOS devices are voltage-controlled due to the physics of construction; nevertheless, the principles of the invention operate equally well.

What is claimed is:

1. A current sharing electronic circuit comprising:
   a plurality of active current flow devices including first, second and third devices, each having base, emitter and collector electrodes;
   all of said collector electrodes being connected together, means connecting together all of the base electrodes of said devices, said means having a terminal;

a transformer for each active device including a first transformer for said first device, a second transformer for said second device, and a third transformer for said third device, each transformer having a primary winding and a secondary winding, and all of said primary windings being substantially identical and all of said secondary windings being substantially identical to provide identically-rated active current flow devices;

all of said secondary windings being connected in series to form a single current flow path with the current flow in each secondary winding being opposite in direction to current flow in the associated primary winding and the series serial connection being such that the dot end of each secondary winding is connected to the non-dotted end of the succeeding transformer secondary winding;

each emitter electrode being coupled through the primary winding of its transformer to a common reference bus; and means for applying a wave of turn-on pulses between said terminal and said common bus, and thus to all of the base electrodes of said devices;

whereby when a turn-on pulse is applied to said devices and said devices turn on, current flows from the collector to the emitter of each of said devices and through the associated primary transformer winding, said current flow through the first device and the first transformer winding generating a secondary current in the path made up of all of said secondary transformer windings, said secondary current causing the primary currents in all of said primary windings to be substantially proportional to the current-carrying capabilities of the active current flow devices.

2. The circuit defined in claim 1 wherein:

when the active devices are generally similar in rating and said transformers are substantially identical, the currents flowing through the active devices are substantially equal.

* * * * *